(12) United States Patent
Matsui

(10) Patent No.: US 9,449,836 B2
(45) Date of Patent: Sep. 20, 2016

(54) METHOD FOR FORMING FEATURES WITH SUB-LITHOGRAPHIC PITCH USING DIRECTED SELF-ASSEMBLY OF POLYMER BLEND

(71) Applicant: Renesas Electronics Corporation, Kawasaki-shi, Kanagawa (JP)

(72) Inventor: Yoshinori Matsui, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 31 days.

(21) Appl. No.: 14/320,913

(22) Filed: Jul. 1, 2014

(65) Prior Publication Data
US 2015/0031209 A1   Jan. 29, 2015

Related U.S. Application Data

(60) Provisional application No. 61/858,428, filed on Jul. 25, 2013.

(51) Int. Cl.
*G03F 7/20* (2006.01)
*H01L 21/308* (2006.01)
*H01L 21/311* (2006.01)

(52) U.S. Cl.
CPC ......... *H01L 21/3088* (2013.01); *G03F 7/2002* (2013.01); *H01L 21/3086* (2013.01); *H01L 21/31144* (2013.01)

(58) Field of Classification Search
CPC ........................................................ G03F 7/26
See application file for complete search history.

(56) References Cited

U.S. PATENT DOCUMENTS

| | | | | |
|---|---|---|---|---|
| 7,976,715 B2 * | 7/2011 | Dobisz | ................... | B82Y 10/00 216/11 |
| 8,507,184 B2 * | 8/2013 | Bae | ..................... | H01L 21/0273 430/311 |
| 2015/0118851 A1 * | 4/2015 | Gao | ................... | H01L 21/0337 438/703 |

* cited by examiner

*Primary Examiner* — Kathleen Duda
(74) *Attorney, Agent, or Firm* — Sughrue Mion, PLLC

(57) ABSTRACT

There is provided a manufacturing method of a semiconductor device including forming a first pattern of first features, according to a lithography process, in a photoresist layer disposed on a substrate, the lithography process having a minimum printable dimension and a minimum printable pitch, applying an additional layer on the photoresist layer having the first pattern formed therein, forming a second pattern of second features in the additional layer, the second features concentric with the first features, and etching portions of the substrate exposed through the second pattern. Further, in the provided method, the first features include geometrical features separated by a distance less than the dimension of minimum printable feature, and the geometrical features are disposed at a pitch less than the minimum printable pitch.

16 Claims, 5 Drawing Sheets

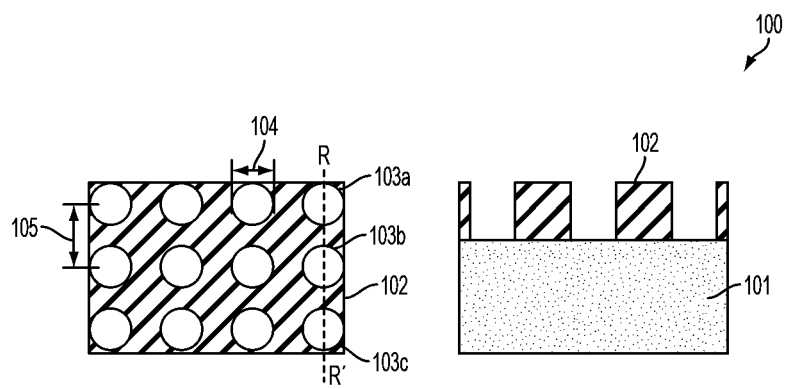
FIG. 1A RELATED ART
FIG. 1B RELATED ART
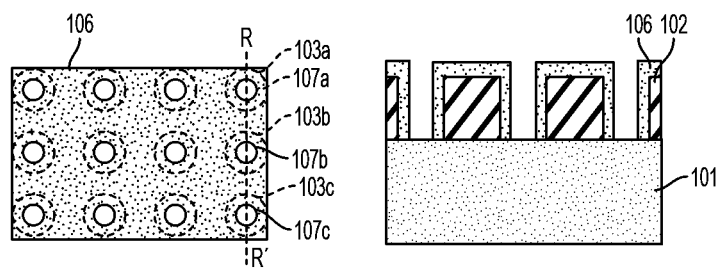
FIG. 1C RELATED ART
FIG. 1D RELATED ART
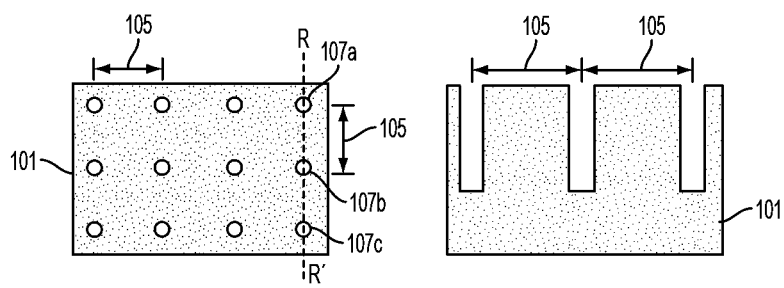
FIG. 1E RELATED ART
FIG. 1F RELATED ART

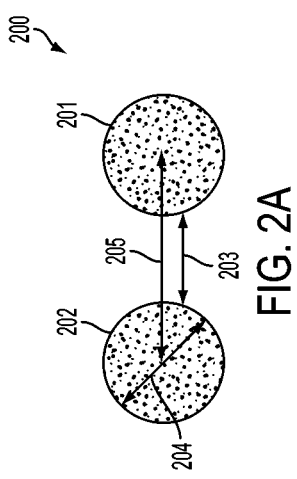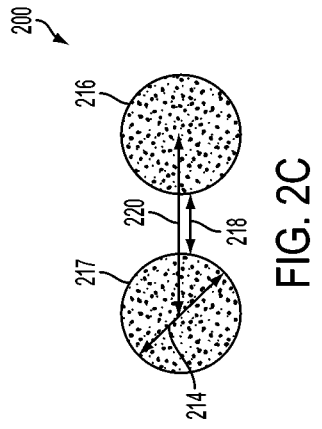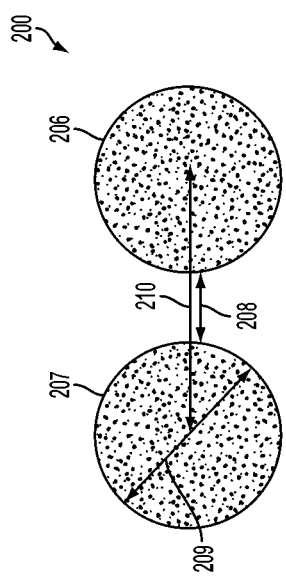

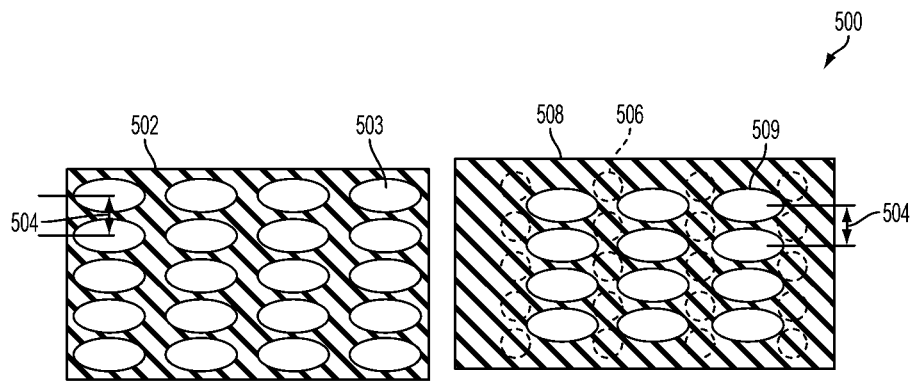
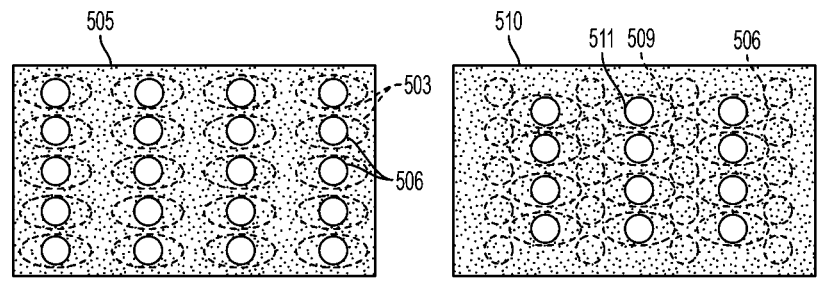
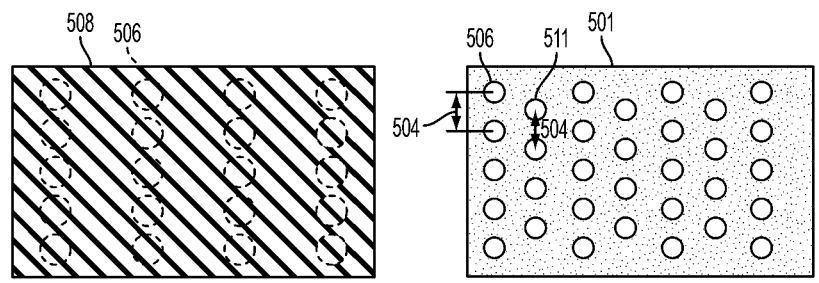
FIG. 5A   FIG. 5D
FIG. 5B   FIG. 5E
FIG. 5C   FIG. 5F

US 9,449,836 B2

METHOD FOR FORMING FEATURES WITH SUB-LITHOGRAPHIC PITCH USING DIRECTED SELF-ASSEMBLY OF POLYMER BLEND

BACKGROUND

1. Field

The current disclosure relates to a method for forming, in a semiconductor substrate or the like, features disposed at a pitch shorter than a minimum printable pitch of a lithography process.

2. Description of Related Art

Photo-lithography (referred hereinafter generally as "lithography process") is an enabling technology in semiconductor device manufacturing. There are many market factors as well as many technological factors which continually drive semiconductor manufacturers to fabricate devices having features with smaller dimensions from one generation to the next. As such, there are significant efforts undertaken by semiconductor device manufacturers to develop processes that may be used to produce features that are smaller in size than a minimum printable dimension (MPD) of a lithography process.

The MPD of a lithography process is the smallest dimension that can be resolved in a photoresist layer given the focus, light energy, wavelength, and other parameters of the light source used in the lithography process. In forming hole patterns, for example, the minimum printable dimension of an Argon Fluoride (ArF, with wavelength $\lambda=193$ nm) immersion lithography process is nominally 50 nm. As such, for example, circular features with diameter substantially shorter than 50 nm cannot be resolved in a photoresist layer utilizing simply an ArF immersion lithography process. While features with diameter substantially shorter than 50 nm can be achieved with an Extreme Ultraviolet (UV) ($\lambda=13.5$ nm) lithography process, unlike the aforementioned ArF immersion lithography process EUV is not suited for high volume manufacturing.

One conventional technique that may be used to reduce the size of a feature below the MPD of a lithography process, like the ArF immersion lithography process, is the use of a directed self-assembly (DSA) layer following a first step of patterning a photoresist layer. A DSA layer is formed by a polymer-blend DSA comprising two distinct polymeric species, hydrophilic polymer and hydrophobic polymer.

In a polymer-blend DSA, one of the two polymeric species has an affinity for the photoresist layer whereas the other species does not. This differential affinity to photoresist may be advantageously used to trigger a self-assembly process that confines each polymeric species to desired regions. In the context of DSA, the self-assembly process is typically activated using a thermal treatment (or cycle) of the DSA layer.

Upon subjecting the DSA layer to a thermal cycle, the polymeric species that has poor affinity to the photoresist assembles away from regions where there is photoresist whereas the polymeric species that has strong affinity for the photoresist layer assembles in proximity to the photoresist. Following the thermal cycling, the polymeric species having poor affinity to the photoresist is removed by either a wet etching or a dry etching process; in either case, the etchant used has high selectivity against the species that have strong affinity to the photoresist, thereby allowing the selective removal of the species having poor affinity to the photoresist.

FIG. 1A-FIG. 1F show an example of an arbitrary lithography process with an added DSA process step for the purpose of obtaining circular features with diameter smaller than a MPD 104 of the arbitrary lithography process. FIG. 1A shows a top view of a semiconductor wafer 100 having disposed thereon a photoresist layer 102. The cross-sectional view of semiconductor wafer 100 along a symmetry line R-R' is shown in FIG. 1B. The substrate 101 is shown in a cross-sectional view of the semiconductor wafer 100. Although, for ease of description, substrate 101 is assumed to be a semiconductor material, an artisan of ordinary skill in the art will readily understand that photoresist layer 102 may also be applied to the top layer of a stack of layers disposed on substrate 101; such a stack of layers may be, for example, a stack of dielectric layers. Alternatively, the photoresist layer 102 may also be applied to a single layer disposed on substrate 101.

As shown in FIG. 1A, a pattern is formed within photoresist layer 102. (Steps of coating, exposing, and developing photoresist layer 102 to form the pattern are omitted for clarity.) Features 103a, 103b, and 103c are holes aligned along the symmetry line R-R', and they are circles with diameter equal to the MPD 104 of the arbitrary lithography process. Further, features 103 are disposed at a minimum printable pitch (MPP) 105 of the arbitrary lithography process (the MPP is described later below).

FIG. 1C shows a top view of semiconductor wafer 100 having a patterned photoresist layer 102 coated with a DSA layer 106, after a thermal cycle which activates the self-assembly process, and after the selective etching of the polymeric species having poor affinity for photoresist layer 102. This DSA process step effectively forms features 107a, 107b, and 107c which are concentric with features 103a, 103b, and 103c respectively. The corresponding cross-sectional view of FIG. 1C along the R-R' line is shown in FIG. 1D. Although not shown in FIG. 1D, the DSA layer 106 may be formed at a bottom of a hole formed by the features 103 and may remain at the bottom of the hole formed by the features 103.

The pattern formed in DSA layer 106 can then be transferred into substrate 101 via either a wet or a dry etching process wherein the etchant has higher selectivity to the substrate 101 than to the DSA layer 106. The resulting structure from the etching process (after stripping the substrate of DSA layer 106 and underlying photoresist layer 102) is shown in FIG. 1E (top view) and FIG. 1F (cross-sectional view along R-R'). As can be seen in FIG. 1E, the features 107a, 107b, and 107c each have a diameter smaller than MPD 104.

While it is possible, as described above, to obtain features smaller in size than MPD 104 utilizing a conventional lithography process with an added conventional DSA step, it is not known how to use these two techniques to produce features that are disposed at a pitch shorter than the minimum printable pitch of the lithography process using at most one photoresist patterning step. The minimum printable pitch (MPP) may be described as the distance measured from center to center of two adjacent features, each having a dimension equal to the MPD. As shown in FIG. 1E, while features 107 are smaller in diameter than MPD 104, features 107 are still disposed at MPP 105.

SUMMARY

One or more embodiments of the invention relates to a manufacturing method of a semiconductor device. The manufacturing method includes forming features in a semiconductor substrate or the like wherein the formed features have a dimension smaller than a minimum printable dimension of a lithography process; forming features in a semiconductor substrate or the like in high density patterns wherein the formed features have a dimension smaller than a minimum printable dimension of a lithography process and are disposed at sub-lithographic pitch in at least one reference direction.

According to another embodiment, there is provided a method comprising forming a first pattern of first features, according to a lithography process, in a photoresist layer disposed on a substrate, the lithography process having a minimum printable dimension and a minimum printable pitch; applying an additional layer on the photoresist layer having the first pattern formed therein; forming a second pattern of second features in the additional layer, the second features concentric with the first features; etching portions of the substrate exposed through the second pattern. Further, in the provided method, the first features comprise geometrical features separated by a distance shorter than the dimension of minimum printable feature, and said geometrical features are disposed at a pitch shorter than the minimum printable pitch. Furthermore, in the provided method, the geometrical features are larger in area than an area of a circle having the minimum printable dimension as a diameter, and the geometrical features satisfy a process window of the lithography process.

According to yet another embodiment, there is provided a method comprising forming a first pattern of first features, according to a lithography process, in a first photoresist layer disposed on a substrate, the lithography process having a minimum printable dimension and a minimum printable pitch; applying an additional layer on the first photoresist layer having the first pattern formed therein; forming a second pattern of second features in the additional layer, the second features concentric with the first features; etching portions of the substrate exposed through the second pattern; and stripping the substrate.

Following stripping the substrate, the method comprises: applying a second photoresist layer on the substrate and forming a third pattern of third features in said second photoresist layer, the third pattern being a translated version of the first pattern; applying a third layer on the second photoresist layer having the third pattern formed therein; forming a fourth pattern of fourth features in the third layer, the fourth features concentric with the third features; etching portions of the substrate exposed through the fourth pattern.

Further, in the provided method, the first features and the third features comprise geometrical features separated by a distance shorter than the minimum printable dimension, and said geometrical features are disposed at a pitch shorter than the minimum printable pitch.

Furthermore, in the provided method, the geometrical features are larger in area than an area of a circle having the minimum printable dimension as a diameter, and the geometrical features satisfy a process window of the lithography process.

These and other features, aspects, and advantages will become better understood with reference to the following description and claims.

BRIEF DESCRIPTION OF THE DRAWINGS

The accompanying drawings, which are incorporated in and constitute a part of this specification, exemplify example embodiments and, together with the description, serve to explain and illustrate the principles, aspects and features of the invention.

FIG. 1A is a top view of a conventional semiconductor wafer having disposed thereon a patterned photoresist layer.

FIG. 1B is a cross-sectional view of the conventional semiconductor wafer of FIG. 1A FIG. 1C is a top view of the conventional semiconductor wafer of FIG. 1A having disposed on the patterned photoresist layer a DSA layer which is patterned following thermal activation.

FIG. 1D is a cross-sectional view of the conventional semiconductor wafer of FIG. 1C.

FIG. 1E is a top view of the conventional semiconductor wafer of FIG. 1D following pattern transfer via the patterned DSA layer.

FIG. 1F is a cross-sectional view of the conventional semiconductor wafer of FIG. 1E FIG. 2A is a pattern comprising circular features having diameter equal to the MPD and disposed at a pitch equal to the MPP.

FIG. 2B is a pattern comprising circular features having diameter greater than the MPD and disposed at a pitch longer than the MPP.

FIG. 2C is a pattern comprising features having diameter equal to the MPD and disposed at a pitch shorter than the MPP.

FIG. 5A shows a third embodiment of the current invention wherein a semiconductor wafer has disposed thereon a patterned photoresist layer.

FIG. 5B shows a top view of the semiconductor wafer of FIG. 5A having disposed on the patterned photoresist layer, a DSA layer which is patterned following thermal activation.

FIG. 5C shows a top view of the semiconductor wafer of FIG. 5B having disposed thereon a photoresist layer following pattern transfer into the semiconductor wafer via the DSA layer mask.

FIG. 5D shows a top view of the semiconductor wafer of 5C having disposed thereon a patterned photoresist layer.

FIG. 5E shows a top view of the semiconductor wafer of FIG. 5D having disposed on the patterned photoresist layer a DSA layer which is patterned following thermal activation.

FIG. 5F shows a top view of the semiconductor FIG. 5F following pattern transfer into the wafer via the DSA layer mask following stripping the DSA layer and the photoresist.

DETAILED DESCRIPTION

Figure 3A:
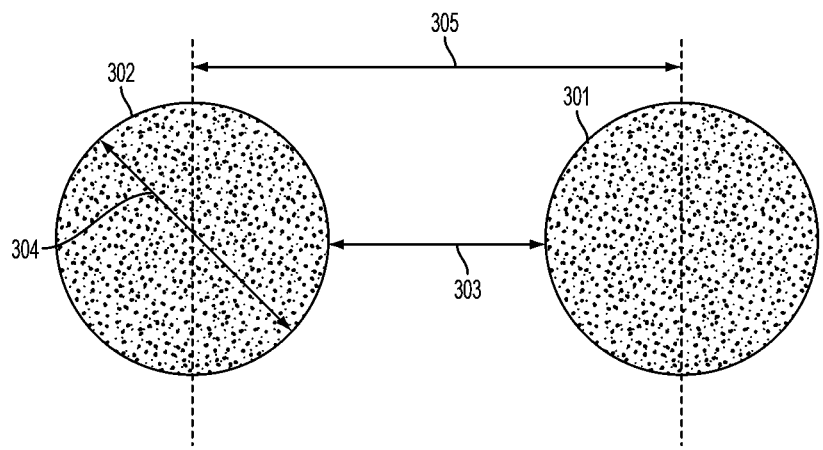
FIG. 3A shows test features having diameter equal to the MPD and disposed at a MPP of a lithography process.

In the following detailed description, reference will be made to the accompanying drawings, in which identical functional elements are designated with like numerals. The aforementioned accompanying drawings show by way of illustration and not by way of limitation, specific embodiments and implementations consistent with the principles of the invention. These embodiments and implementations are described in sufficient detail to enable those skilled in the art to practice the invention and it is to be understood that other embodiments and implementations may be utilized and that structural changes and/or substitutions of various elements may be made without departing from the scope and spirit of the invention. Accordingly, various changes, modifications, and equivalents of the methods, techniques and devices described herein will be apparent to those of ordinary skill in the art. Moreover, descriptions of well-known process steps and materials may be omitted for increased clarity and conciseness.

FIG. 2A through FIG. 2C illustrate several test features 200 used in lithography processing, which are shown in relative scale dimensions with respect to each other. The following discussion relates to which test features satisfy a process window of a lithography process having a specific MPD (204 in FIG. 2A) and a specific MPP (205 in FIG. 2A). A process window of a lithography process is a set of values of process parameters for manufacturing a semiconductor device within preset dimensional tolerances in order to ensure proper operation under desired specification. For instance, a process window may be the set of focus and exposure dose that allow features to be reproduced to within a certain tolerance. Although the process window is described as being dependent upon focus and exposure dose, other variables may also influence the process window.

FIG. 2A illustrates a first test feature 201 and a second test feature 202 wherein each test feature is circular and has a diameter equal to MPD 204 and wherein test feature 201 and test feature 202 are disposed at a pitch equal to MPP 205. For an ArF immersion lithography process, MPD 204 is equal to 50 nm, MPP 205 is equal to 90 nm, and separation distance (SD) 203, the separation distance between first test feature 201 and second test feature 202, is equal to 40 nm. Accordingly, test feature 201 and test feature 202 satisfy the process window of the ArF lithography process since test feature 201 and test feature 202 are all disposed at least at the MPP of the ArF immersion lithography process and the features have diameters at least equal in size to the MPD of the ArF immersion lithography process.

Similarly, FIG. 2B illustrates a case where a process window of the ArF immersion lithography process is satisfied. Namely, in FIG. 2B, a first test feature 206 and a second test feature 207 each have a diameter greater than MPD 204, and test feature 206 and test feature 207 are disposed at a pitch greater than MPP 205. In other words, dimension 209, pitch 210 are greater than the critical values shown in FIG. 2A, even though SD 208 is shorter than SD 203 unless the test features 206 and 207 are merged.

Conversely, FIG. 2C shows a case where the process window is not satisfied. In FIG. 2C, while test features 216 and 217 have diameters equal to MPD 204, pitch 220 is shorter than MPP 205. As such, the process window of the lithography is not satisfied.

Figure 3B:
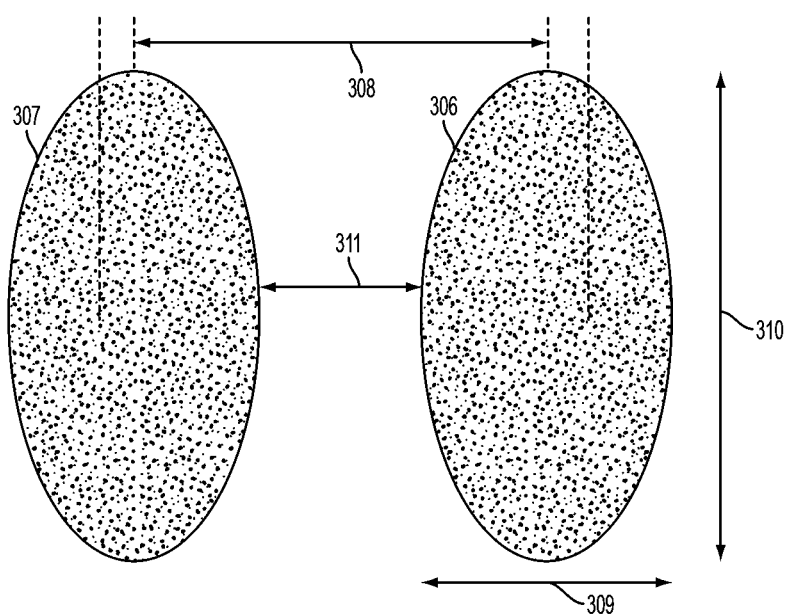
FIG. 3B shows a first embodiment of the current invention wherein a process window of a lithography process is satisfied.

FIGS. 3A and 3B are shown in relative scale dimensions. FIG. 3A shows conventional features with circular shapes 301 and 302 disposed at a minimum printable pitch MPP 305 and with MPD 304, that satisfy the process window. Further, FIG. 3B shows features 306 and 307 which have elliptical shapes, according to an embodiment of the invention.

Features 306 and 307 satisfy the process window since they are disposed at a pitch 308 shorter than MPP 305 (in FIG. 3A) as indicated by the vertical dashed lines in FIG. 3A and FIG. 3B, and each of features 306 and 307 are larger in area than an area of a circle with MPD 304 as a diameter and are disposed at a distance 311 shorter than SD 303. For example, in an ArF immersion lithography process the area of the features 301 and 302 is 625π (e.g., 301=302=25×25×π=625π). In an ArF immersion lithography process the area of the features 306 and 307 is 1035π (e.g., 306=307=23×45×π=1035π), which is greater than the area of the features 301 and 302. The larger the area of the features, the easier it is to satisfy the process window. That is, as long as the process window has an area that is greater than or equal to an area of circular shapes disposed at a MPP with and MPD, the process window is satisfied. In this example 1035π is greater than 625π, thus the process window is satisfied.

Further, features 306 and 307 include a major axis 310 and a minor axis 309, the major axis 310 substantially longer than the minor axis 309, so as to form an ellipse. For example, in FIG. 3B, the process window of an ArF immersion lithography process (i.e. MPD 304=50 nm and MPP 305=90 nm) is satisfied for major axis 310=90 nm, minor axis 309=46 nm, and pitch 308=76 nm. Table 1 shows the dimensions for conventional circular features with the elliptical-shaped features found to satisfy the process window.

Although, the current embodiment of the invention is discussed in the context of an ArF immersion lithography process, it is noted that the present disclosure is not limited to such a process. For example, other lithography processes such as a Krypton Fluoride (KrF) lithography process (λ=248 nm), a dry ArF (λ=193 nm) lithography process or Extreme Ultraviolet (EUV) (λ=13.5 nm) lithography process may be used. Further, it is noted that although FIG. 3B illustrates elliptical features, the present disclosure is not limited to such geometrical shapes. In other words, geometrical shapes that satisfy the dimensional relationships between a minor and a major axis with respect to the minimum printable pitch and with respect to the minimum printable dimension are also within the scope of the present disclosure. As described in Table 1 below, the elliptical features have a major axis that is substantially longer than the minor axis.

TABLE 1

| | Minor & Major Axis | Pitch | Separation Distance |
|---|---|---|---|
| ArF Immersion Lithography Process (circular features) | 50 nm × 50 nm | 90 nm | 40 nm |
| ArF Immersion Lithography Process (elliptical features) | 46 nm × 90 nm | 76 nm | 30 nm |

For example, in an alternative embodiment, another non-circular shape could be used such as a rectangular-shaped feature with one side substantially longer than the other so as to make the area of the rectangular-shaped feature larger than the area of a circle with MPD 304 as a diameter.

FIGS. 4A-4F show a device according to an embodiment of the invention that has features with a diameter smaller than a MPD of a lithography process and disposed at a pitch shorter than a MPP of the lithography process which can be obtained to process a semiconductor device.

Figure 4A:
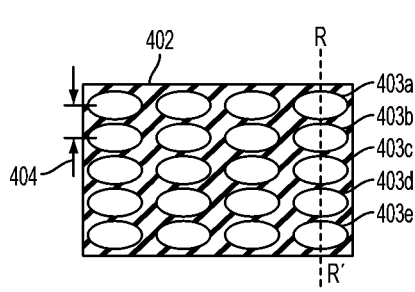
FIG. 4A shows a second embodiment of the current invention wherein a semiconductor wafer has disposed thereon a patterned photoresist layer.
Figure 4B:
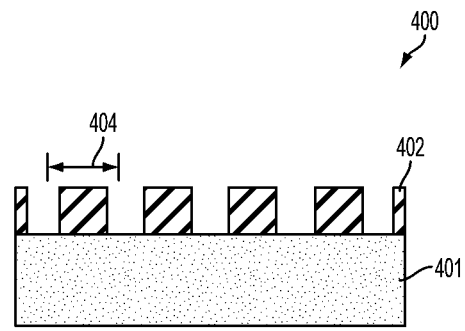
FIG. 4B shows a cross-sectional view of a semiconductor wafer of FIG. 4A.

FIG. 4A shows a top view of a semiconductor wafer 400 having disposed thereon a photoresist layer 402. The cross-sectional view of semiconductor wafer 400 along a symmetry line R-R' is shown in FIG. 4B. The substrate 401 is shown in the cross-sectional view of the semiconductor wafer 400. Again, although for ease of description, substrate 401 is assumed to be a semiconductor material, an artisan of ordinary skill in the art will readily understand that photoresist layer 402 may also be in fact applied to the top layer of a stack of layers disposed on substrate 401; such a stack of layers may be, for example, a stack of dielectric layers. Alternatively, the photoresist layer 402 may also be applied to a single layer disposed on substrate 401.

As shown in FIG. 4A, a pattern is formed within photoresist layer 402. (Steps of coating, exposing, and developing photoresist layer 402 to form the pattern are omitted for clarity). The pattern includes features collectively referred to with reference numeral 403. Features 403a-403e are specific features along the symmetry line R-R', and they are ellipses which are disposed at pitch 404; pitch 404 is shorter than a MPP 305 of the arbitrary lithography process as described with reference to FIGS. 3A and 3B. Further, while all features 403 are shown to be ellipses, it will be understood that the techniques described here are not limited only to elliptical shapes, but other such geometrical shapes may be formed.

Figure 4C:
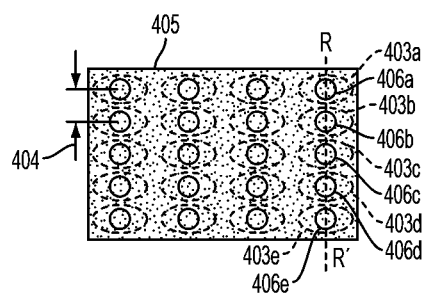
FIG. 4C shows a top view of the semiconductor wafer of FIG. 4A having disposed on the patterned photoresist layer, a DSA layer which is patterned following thermal activation.
Figure 4D:
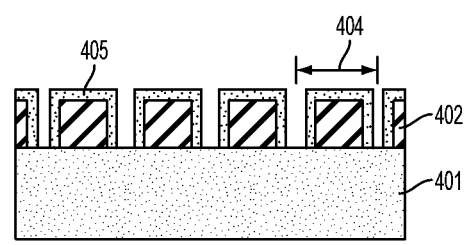
FIG. 4D shows a cross-sectional view of the semiconductor wafer of FIG. 4C.

FIG. 4C shows a top view of semiconductor wafer 400 having patterned photoresist layer 402 coated with a DSA layer 405, after a thermal cycle which activates the self-assembly process, and after the selective etching of the polymeric species having poor affinity for photoresist layer 402. This DSA process step effectively forms features 406a-406e, which are concentric with features 403a-403e, respectively. The corresponding cross-sectional view of FIG. 4C along the R-R' line is shown in FIG. 4D. As shown in FIGS. 4C and 4D, features 406a-406e are also disposed at pitch 404 since features are 406a-406e are concentric with features 403a-403e, respectively. Although not shown in FIG. 4D, the DSA layer 405 may be formed at a bottom of a hole formed by the features 403. In some embodiments, the DSA layer may remain at the bottom the hole formed by the features 403.

Figure 4E:
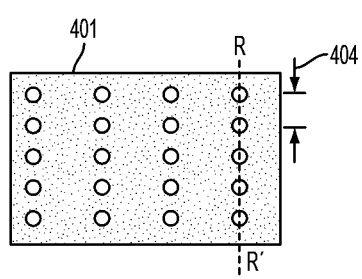
FIG. 4E shows a top view of the semiconductor wafer of FIG. 4D following pattern transfer via the patterned DSA layer.
Figure 4F:
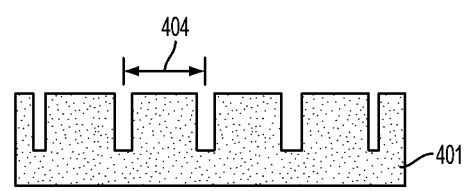
FIG. 4F is a cross-sectional view of the semiconductor wafer of FIG. 4E.

The pattern formed in DSA layer 405 can then be transferred into substrate 401 via either a wet or a dry etching process wherein the etchant has higher selectivity to the substrate 401 than to the DSA layer 405. The resulting structure from the etching process (after stripping the DSA layer 405 and underlying photoresist layer 402) is shown in FIG. 4E (top view) and FIG. 4F (cross-sectional view along R-R'). As can be seen in FIG. 4E, the features 406a-406e, are disposed at a pitch 404 that is shorter than the MPP 305.

Accordingly, it is possible according to the above-described embodiment, to obtain features smaller in size than MPD 304 utilizing a lithography process combined with a DSA process step in which the resulting features 406a-406e are disposed at a pitch 404 shorter than MPP of the lithography process (MPP 305 in FIG. 3A). In the embodiment shown in FIGS. 4A-4F an ArF immersion lithography process can be used which can achieve a pitch 404 of 76 nm which is smaller when compared to the MPP 305 of 90 nm.

Accordingly, since pitch 404 is shorter than the pitch of the lithography process (MPP 305 in FIG. 3A), it is possible to produce high-density patterns with a single step of patterning the photoresist layer 402. In contrast with a conventional method, since the smallest pitch achievable is the minimum printable pitch (MPP 305), placing two features at a pitch shorter than MPP 305 would require first patterning a photoresist layer to form one feature and independently patterning the photoresist layer at another location to pattern a second feature. In other words, at least two photoresist patterning steps would be required using a conventional method. Thus, in a general sense, the novel technique described here has an advantage of requiring only N photoresist patterning steps for resolving two features disposed at a pitch shorter than the MPP, whereas a conventional lithography requires N+1 or more photoresist patterning steps.

According to yet another embodiment, DSA is used in a first lithography process, then in a second lithography process, a normal lithography without DSA can be applied. That is to say, in some embodiments, DSA is not always required in the multiple lithography processes.

According to yet another embodiment of the present invention, as shown in FIGS. 5A-5F, it is possible to obtain a plurality of features that form a high density pattern wherein each feature of the plurality of features is disposed at a pitch 504 shorter than the MPP of the lithography process (MPP 305 as described in FIG. 3A).

FIG. 5A shows a top view of a semiconductor wafer 500 having disposed thereon a photoresist layer 502, patterned with features 503. The features 503 shown are elliptically shaped. The substrate 501 (not shown in FIG. 5A) is a semiconductor material for illustrative purposes only; however, an artisan of ordinary skill in the art will readily understand that photoresist layer 502 may also be in fact applied to the top layer of a stack of layers disposed on substrate 501; such a stack of layers may be, for example, a stack of dielectric layers. Alternatively, the photoresist layer 502 may also be applied to a single layer disposed on substrate 501. The elliptical features 503 have a pitch, along their minor axes, 504, which is smaller than the conventional pitch 305.

FIG. 5B shows a top view of semiconductor wafer 500 having patterned photoresist layer 502 coated with a DSA layer 505, after a thermal cycle which activates the self-assembly process, and after the selective etching of the polymeric species having poor affinity for photoresist layer 502. This DSA process step effectively forms features 506, which are concentric with features 503 formed in photoresist layer 502. Following the patterning of DSA layer 505, features 506 are transferred into the substrate 501 via either a wet or a dry etching process, wherein the etchant has higher selectivity to the substrate than to DSA layer 505. DSA layer 505 and photoresist layer 502 are then stripped from the substrate.

As shown in FIG. 5C, following the above-mentioned process steps, another photoresist layer 508 is coated on the substrate 501 having features 506 formed therein. Subsequently, a pattern is formed in photoresist layer 508. The newly formed pattern comprises features 509 as shown in FIG. 5D. Features 509 also are elliptically shaped and are a translated version of features 503 when considering the positioning of the latter on the substrate 501 (see FIG. 5A). The features 509 also have a pitch 504 along their minor axes, which is smaller than the conventional pitch 305.

FIG. 5E shows a top view of semiconductor wafer 500 having patterned photoresist layer 508 coated with a DSA layer 510, after a thermal cycle which activates the self-assembly process, and after the selective etching of the polymeric species having poor affinity for photoresist layer 508. As mentioned above, in some embodiments it is not required that this second lithography process use lithography with DSA. One having ordinary skill in the art having read this specification could modify the process described herein so that this second lithography process uses lithography without DSA, thus a redundant discussion is omitted.

This process step effectively forms features 511, which are concentric with features 509 formed in photoresist layer 508. Following the patterning of DSA layer 510, features 511 are transferred into the substrate 501 via either a wet or a dry etching process, wherein the etchant has higher selectivity to the substrate than to DSA layer 510.

As shown in FIG. 5F, after stripping the DSA layer 510 and photoresist layer 508, a high density pattern is formed in substrate 501, wherein the pattern consists of features 506 and 511. The present embodiment achieves high density features to be formed using two (2) photoresist patterning steps, whereas the conventional process would require three (3) photoresist patterning steps to achieve a similar pattern. Accordingly, this embodiment allows high density patterns to be formed at sub-lithographic pitch. Since sub-lithographic pitch can be readily achieved, the novel techniques described herein allow high density pattern formation with fewer exposure steps than conventional methods.

Although a few example embodiments have been shown and described, these example embodiments are provided to convey the subject matter described herein to those who are familiar with this field. It should be understood that the subject matter described herein may be embodied in various forms without being limited to the described embodiments. The subject matter described herein can be practiced without those specifically defined or described matters or with other or different elements or matters not described. It will be appreciated by those familiar with this field that changes may be made in these embodiments without departing from spirit and scope of the invention as described herein and as defined in the appended claims and their equivalents.

Aspects related to the embodiments described here have been set forth in part in the description above, and in part should be apparent from the description, or may be learned by practice of the invention. Aspects of the embodiments may be realized and attained by means of the elements and combinations of various elements and aspects particularly pointed out in the detailed description and the appended claims. It is to be understood that both the foregoing descriptions are exemplary and explanatory only and are not intended to be limiting.

What is claimed:

1. A manufacturing method of a semiconductor device, the manufacturing method comprising:
   forming a first pattern of first features, according to a lithography process, in a photoresist layer disposed on a substrate, the lithography process having a minimum printable dimension and a minimum printable pitch;
   applying an additional layer on the photoresist layer having the first pattern formed therein;
   forming a second pattern of second features in the additional layer, the second features being concentric with the first features; and
   etching portions of the substrate exposed through the second pattern,
   the first features each comprise a geometrical feature separated by a distance less than the minimum printable dimension, and the geometrical features are disposed at a pitch less than the minimum printable pitch.

2. The manufacturing method of a semiconductor device of claim 1, wherein
   the geometrical features have an area that is greater than an area of a circle having the minimum printable dimension as a diameter.

3. The manufacturing method of a semiconductor device of claim 2, wherein the geometrical features satisfy a process window of the lithography process.

4. The manufacturing method of a semiconductor device of claim 1, wherein the first features are ellipses which have a major axis and a minor axis, the major axis being longer than the minor axis and wherein the second features are circles.

5. The manufacturing method of a semiconductor device of claim 1, wherein the additional layer is a directed self-assembly (DSA) layer including a blend DSA.

6. The manufacturing method of a semiconductor device of claim 5, wherein the second pattern is formed by thermally activating the DSA layer and subsequently patterning the DSA layer.

7. The manufacturing method of a semiconductor device of claim 1, wherein the distance that separates the geometrical features is less than 50 nanometers (nm) and greater than or equal to about 30 nm, and the pitch of said geometrical features are disposed at is less than 90 nm and greater than or equal to about 76 nm.

8. The manufacturing method of a semiconductor device of claim 7, wherein the lithography process is an Argon Fluoride (ArF) immersion lithography process.

9. A manufacturing method of a semiconductor device, the method comprising:
   forming a first pattern of first features, according to a lithography process, in a first photoresist layer disposed on a substrate, the lithography process having a minimum printable dimension and a minimum printable pitch;
   applying an additional layer on the first photoresist layer having the first pattern formed therein;
   forming a second pattern of second features in the additional layer, the second features being concentric with the first features;
   etching portions of the substrate exposed through the second pattern;
   stripping the substrate;
   applying a second photoresist layer on the substrate and forming a third pattern of third features in said second photoresist layer, the third pattern being a translated version of the first pattern;
   applying a third layer on the second photoresist layer having the third pattern formed therein;
   forming a fourth pattern of fourth features in the third layer, the fourth features concentric with the third features; and
   etching portions of the substrate exposed through the fourth pattern; and
   the first features and the third features comprising geometrical features separated by a distance that is less than the minimum printable dimension, and the geometrical features are disposed at a pitch less than the minimum printable pitch.

10. The manufacturing method of a semiconductor device of claim 9, wherein
    the geometrical features have an area that is greater than an area of a circle having the minimum printable dimension as a diameter.

11. The manufacturing method of a semiconductor device of claim 10, wherein the geometrical features satisfy a process window of the lithography process.

12. The manufacturing method of a semiconductor device of claim 10,
    wherein the first features and the third features are ellipses which have a major axis and a minor axis, the major axis being longer than the minor axis, and the second features and the fourth features are circles.

13. The manufacturing method of a semiconductor device of claim 10, wherein one of the additional layer and the third layer is a directed self-assembly (DSA) layer including polymer-blend DSA.

14. The manufacturing method of a semiconductor device of claim 13,
wherein one of the second pattern and the fourth pattern is formed by thermally activating the DSA layer and patterning the DSA layer.

15. The manufacturing method of a semiconductor device of claim 9, wherein
the distance that separates two of the geometrical features is less than 50 nm and greater than or equal to about 30 nm, and the pitch of the two geometrical features are disposed at is less than 90 nm and greater than or equal to about 76 nm.

16. The manufacturing method of a semiconductor device of claim 15,
wherein the lithography process is an Argon Fluoride (ArF) immersion lithography process.

* * * * *